United States Patent
Lawrence

(10) Patent No.: US 8,348,135 B2
(45) Date of Patent: Jan. 8, 2013

(54) SOLDER FLUX

(75) Inventor: Frank Timothy Lawrence, Sunbury-on-Thames (GB)

(73) Assignee: Henkel Limited, Hertfordshire (GB)

( * ) Notice: Subject to any disclaimer, the term of this patent is extended or adjusted under 35 U.S.C. 154(b) by 17 days.

(21) Appl. No.: 12/692,160

(22) Filed: Jan. 22, 2010

(65) Prior Publication Data

US 2010/0143658 A1   Jun. 10, 2010

Related U.S. Application Data

(63) Continuation of application No. PCT/EP2008/059334, filed on Jul. 16, 2008.

(30) Foreign Application Priority Data

Jul. 23, 2007 (IE) ................................. 2007/0530

(51) Int. Cl.
*B23K 31/12* (2006.01)
*B23K 35/24* (2006.01)

(52) U.S. Cl. ........... 228/103; 228/102; 228/104; 148/23

(58) Field of Classification Search ............... 228/102, 228/103, 104; 148/23
See application file for complete search history.

(56) References Cited

U.S. PATENT DOCUMENTS

| | | | |
|---|---|---|---|
| 1,437,641 A | 12/1922 | Ferriere et al. | |
| 3,139,360 A * | 6/1964 | Voida | 148/23 |
| 3,436,278 A * | 4/1969 | Poliak | 148/23 |
| 3,607,253 A | 9/1971 | Cain et al. | |
| 4,042,725 A | 8/1977 | Nomaki et al. | |
| 4,170,472 A | 10/1979 | Olsen et al. | |
| 4,667,871 A | 5/1987 | Mizuhara | |
| 4,670,217 A | 6/1987 | Henson et al. | |
| 4,670,298 A * | 6/1987 | Lucas et al. | 228/201 |
| 4,695,428 A | 9/1987 | Ballentine et al. | |
| 4,758,407 A | 7/1988 | Ballentine et al. | |
| 4,778,733 A | 10/1988 | Lubrano et al. | |
| 4,806,309 A | 2/1989 | Tulman | |
| 4,879,096 A | 11/1989 | Naton | |
| 4,929,423 A | 5/1990 | Tucker et al. | |
| 5,094,813 A | 3/1992 | Kale | |
| 5,102,748 A | 4/1992 | Wylam et al. | |
| 5,108,024 A * | 4/1992 | Kazem-Goudarzi et al. | 228/104 |
| 5,147,471 A | 9/1992 | Kronberg | |

(Continued)

FOREIGN PATENT DOCUMENTS

EP        0 251 611 A    1/1988

(Continued)

OTHER PUBLICATIONS

Technical Paper: "Hydrogenated Castor Oil Based Rheology Modifiers", www.crayvalley.com, 2001, XP002504785.

*Primary Examiner* — Devang R Patel
(74) *Attorney, Agent, or Firm* — Steven C. Bauman

(57) ABSTRACT

A soldering flux composition comprising: (i) a carrier vehicle comprising a solvent; (ii) an activator component for activating a metal surface for soldering; (iii) a color-imparting component with an appropriate color to facilitate optical detection of flux on the fluxed component; and optionally (iv) a gelling component to control flux rheology. The color-imparting component is utilized to indicate the presence of desired amounts of flux. A component with inadequate flux for reliable soldering can be rejected.

5 Claims, 2 Drawing Sheets

U.S. PATENT DOCUMENTS

| | | | |
|---|---|---|---|
| 5,242,658 A | 9/1993 | Stevens et al. | |
| 5,256,370 A | 10/1993 | Slattery et al. | |
| 5,316,205 A | 5/1994 | Melton | |
| 5,320,272 A | 6/1994 | Melton et al. | |
| 5,328,660 A | 7/1994 | Gonya et al. | |
| 5,344,607 A | 9/1994 | Gonya et al. | |
| 5,352,407 A | 10/1994 | Seelig et al. | |
| 5,390,080 A | 2/1995 | Melton et al. | |
| 5,393,489 A | 2/1995 | Gonya et al. | |
| 5,405,577 A | 4/1995 | Seelig et al. | |
| 5,411,703 A | 5/1995 | Gonya et al. | |
| 5,414,303 A | 5/1995 | Gonya et al. | |
| 5,429,689 A | 7/1995 | Shangguan et al. | |
| 5,435,968 A | 7/1995 | Panthofer | |
| 5,439,639 A | 8/1995 | Vianco et al. | |
| 5,452,842 A | 9/1995 | Melton et al. | |
| 5,455,004 A | 10/1995 | Slattery et al. | |
| 5,527,628 A | 6/1996 | Anderson et al. | |
| 5,538,686 A | 7/1996 | Chen et al. | |
| 5,569,433 A | 10/1996 | Chen et al. | |
| 5,580,520 A | 12/1996 | Slattery et al. | |
| 5,658,528 A | 8/1997 | Ninomiya et al. | |
| 5,698,160 A | 12/1997 | Chen et al. | |
| 5,718,868 A | 2/1998 | Ninomiya et al. | |
| 5,730,932 A | 3/1998 | Sarkhel et al. | |
| 5,733,501 A | 3/1998 | Takao et al. | |
| 5,755,896 A | 5/1998 | Paruchuri et al. | |
| 5,762,866 A | 6/1998 | Jin et al. | |
| 5,817,194 A | 10/1998 | Nagai et al. | |
| 5,820,697 A | 10/1998 | Hamilton et al. | |
| 5,837,191 A | 11/1998 | Gickler | |
| 5,843,371 A | 12/1998 | Yoo et al. | |
| 5,851,482 A | 12/1998 | Kim | |
| 5,863,493 A | 1/1999 | Achari et al. | |
| 5,874,043 A | 2/1999 | Sarkhel et al. | |
| 5,914,536 A * | 6/1999 | Shizuki et al. | 257/778 |
| 5,918,795 A | 7/1999 | Yamaguchi et al. | |
| 5,932,030 A | 8/1999 | Fukasawa et al. | |
| 6,231,691 B1 | 5/2001 | Anderson et al. | |
| 6,241,385 B1 | 6/2001 | Hof | |
| 2004/0124228 A1* | 7/2004 | Chang | 228/103 |
| 2006/0071052 A1* | 4/2006 | Conlon et al. | 228/103 |

FOREIGN PATENT DOCUMENTS

| | | |
|---|---|---|
| EP | 0 336 575 A | 10/1989 |
| EP | 0 620 077 A | 10/1994 |
| EP | 0 629 463 A | 12/1994 |
| EP | 0 629 464 A | 12/1994 |
| EP | 0 629 465 A | 12/1994 |
| EP | 0 629 466 A | 12/1994 |
| EP | 0 629 467 A | 12/1994 |
| EP | 1795296 A | 6/2007 |
| GB | 2158459 | 11/1985 |
| JP | 60-170594 A | 9/1985 |
| JP | 5 -50286 | 3/1993 |
| JP | 6-087090 A | 3/1994 |
| JP | 8-230598 | 9/1996 |
| WO | WO 94/02563 A | 2/1994 |
| WO | WO 2008/009475 A | 1/2008 |

* cited by examiner

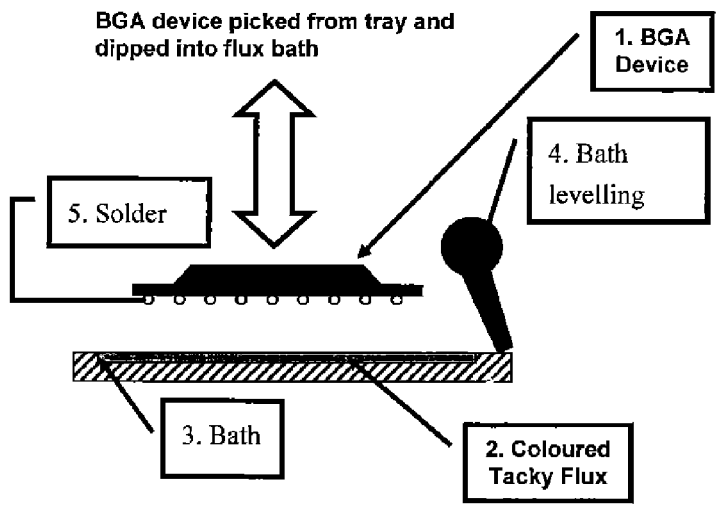

Step 1: BGA is picked from storage tray by vacuum cup (not shown) and dipped in flux bath
Bath is levelled by scraper blade after each component is dipped

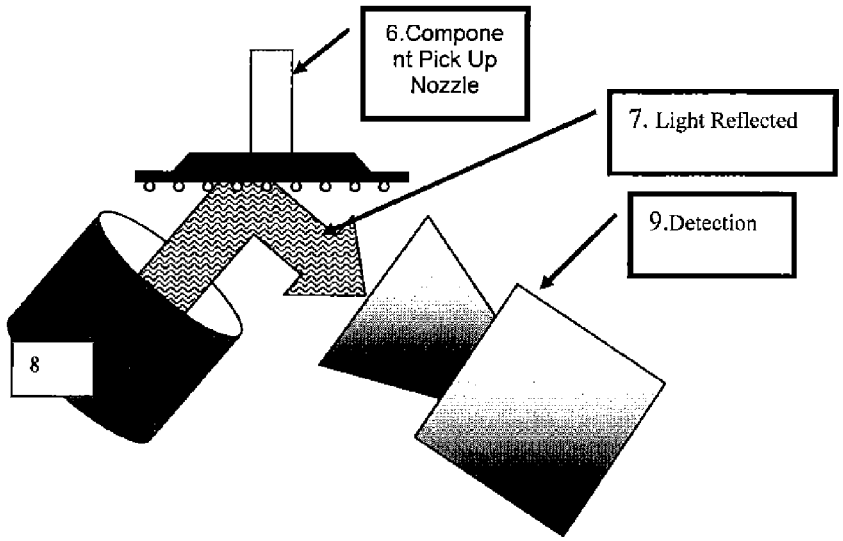

Step 2: BGA is moved into position over light source and detection camera to ensure flux is present on BGA spheres

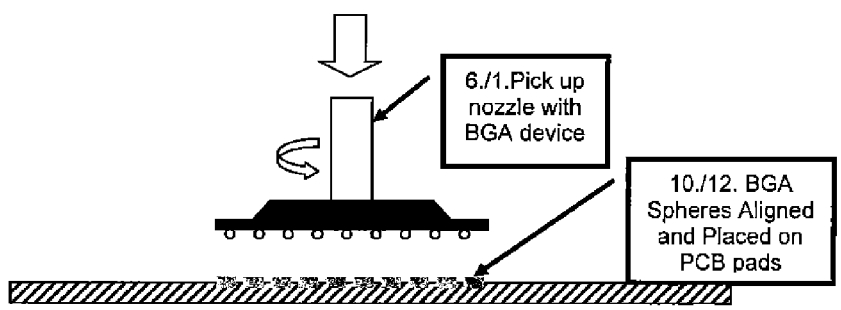

Step 3: Fluxed BGA is moved into correct alignment with PCB pads and placed on pads using vacuum nozzle placement head, with rotational alignment of component or board if required Figure 1: Application of Tacky Flux, Detection, and Assembly on PCB

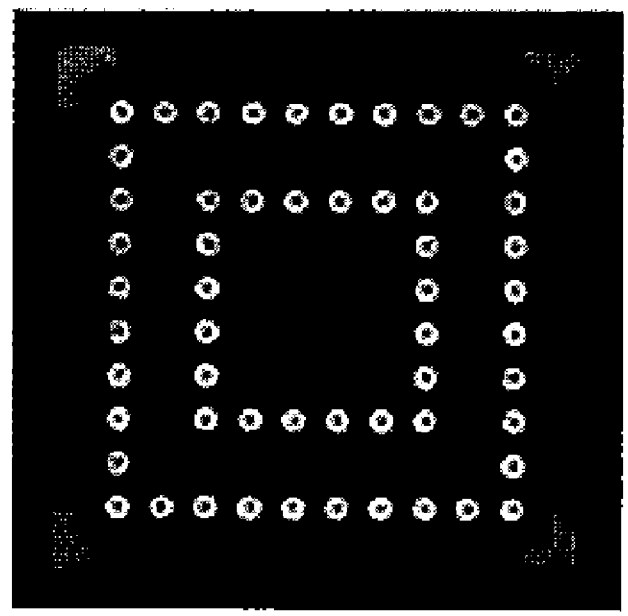
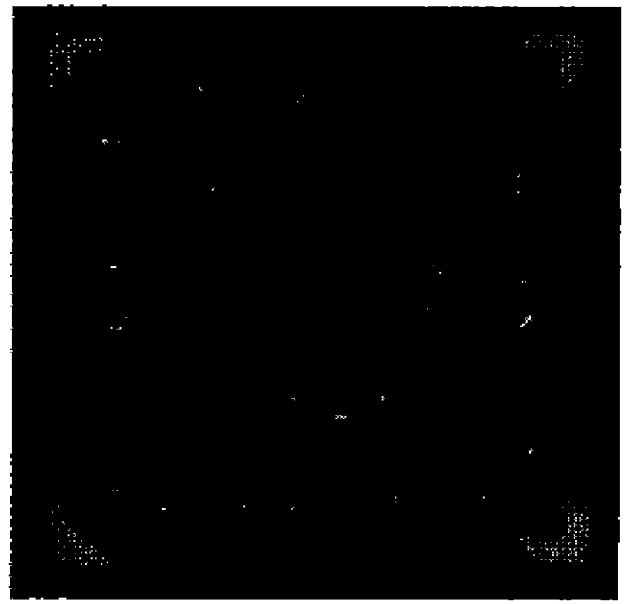
Figure 2

SOLDER FLUX

CROSS REFERENCE TO RELATED APPLICATIONS

This application is a continuation under 35 U.S.C. Sections 365(c) and 120 of International Application No. PCT/EP2008/059334, filed on Jul. 16, 2008 and published on Jan. 29, 2009 as WO 2009/013210, which claims priority to Irish Patent Application No. 2007/0530 filed Jul. 23, 2007, which are incorporated herein by reference in their entirety.

BACKGROUND OF THE INVENTION

1. Field of the Invention

This invention relates to the field of fluxes in particular direct chip attach (DCA) flux material. Of particular interest within the present invention are fluxes of the type suitable for use in processes where the article to be fluxed is dipped in a reservoir of the flux material prior to placement and soldering. These are commonplace for "package on package" (PoP) electronic assemblies and the like.

2. Description of Related Technology

Soldering processes are well-known. These range from hand-soldering methods to machine soldering methods. It is well-known to use a flux material with the soldering material. The flux material satisfies a number of functions. Generally a main function of the flux material is to ensure that conductive material of a first component, for example a support substrate such as a printed circuit board (PCB) interconnects well with good electrical conduction across the solder interconnect to a second component such as an electronic component. Utilising solder alone will not form an interconnect.

To form a successful interconnection it is necessary to apply a fluxing material. A number of different alternatives have been used. It is known for example to include a solid flux material within the soldering material. Generally such a soldering material would then be provided in a wire or other such solid form which would incorporate a core of flux material running through the solder. As the solder melts upon heating, the flux is activated, and the resulting interconnect formed if the soldering process is of an acceptable standard.

It is also known to use solder paste materials. Solder pastes are generally homogenous, stable suspensions of solder particles in a flux medium material.

Reflow soldering is used in the automated manufacture of PCB's, wherein electronic components are surface mounted on PCB's to which a solder paste material has previously been applied by a method such as screen or stencil printing or dispensing. The PCB is then subjected to a sufficiently high temperature, to cause the solder to liquefy and to join the components in place on the PCB. The heat can be supplied by, for example, infrared, heated conveyor belt or convective means.

In light of circuit miniaturization and complexity increasingly demanded by modern electronics devices, for example mobile telephones, soldering processes have emerged such as those that can be applied by a pick-and-dip process. For example a flux in the form of a tacky fluid is employed. A tacky fluid in this context is one that can be applied by a pick-and-dip process but which is sufficiently tacky to remain in place on a dipped component for subsequent soldering.

The pick-and-dip process is typically used for components that already have pre-applied solder. Many electronic components are manufactured with sufficient solder on-board the component to allow the component to be subsequently soldered to a substrate. The substrate may be a circuit board or indeed another electronic component.

It is desirable to apply the tacky flux directly to a component that has been manufactured with solder already in place. Tacky flux may, for example, be applied to a ball grid array (BGA) or a bumped application specific integrated circuit (ASIC).

Typically this application of the tacky flux is achieved by dipping in a reservoir. The reservoir will typically be very shallow and dipping will immerse only the pre-applied solder to the desired depth.

Once the tacky flux is applied, the component can be placed on the substrate such a PCB prior to reflow. Generally the tacky flux provides green strength (holding the component in place before soldering). Such tacky fluxes are generally substantially colourless or may have a slight colouring imparted by the components of the composition. For example if rosin is used it may impart slight yellow to orange colouring when a relatively large volume of composition is viewed. In the small quantities applied to the solder the flux is substantially colourless and is generally not seen.

In the past the majority of solder compositions used were of the tin-lead type which proved useful in most common applications. The flux materials of the present invention may be employed with such solder compositions.

The use of lead in solder composition has come under scrutiny and has become undesirable for environmental and health reasons. As a result, attempts have been made to eliminate the requirement for lead from solder compositions. Such lead-free solder compositions typically include tin, copper and silver (typically 95.5% by weight tin, 4% by weight silver and 0.5% by weight copper). Bismuth may also be used together with tin, antimony and silver in a range of approximately 1.0% to 4.5% by weight. Patents directed to lead-free alloys include U.S. Pat. Nos. 1,437,641, 3,607,253, 4,042,725, 4,170,472, 4,667,871, 4,670,217, 4,695,428, 4,758,407, 4,778,733, 4,806,309, 4,879,096, 4,929,423, 5,094,813, 5,102,748, 5,147,471, 5,242,658, 5,256,370, 5,316,205, 5,320,272, 5,328,660, 5,344,607, 5,352,407, 5,390,080, 5,393,489, 5,405,577, 5,411,703, 5,414,303, 5,429,689, 5,435,968, 5,439,639, 5,452,842, 5,455,004, 5,527,628, 5,538,686, 5,569,433, 5,580,520, 5,658,528, 5,698,160, 5,718,868, 5,730,932, 5,733,501, 5,755,896, 5,762,866, 5,817,194, 5,837,191, 5,843,371, 5,851,482, 5,863,493, 5,874,043, 5,918,795, and 6,231,691; European Patent Documents EP-A-0 251 611, EP-A-0 336 575, EP-A-0 629 463, EP-A-0 629 464, EP-A-0 629 465, EP-A-0 629 466, and EP-A-0 629 467; Great Britain Patent Document GB-A-2, 158,459; Japanese Patent Documents JP-A-5050286, and JP-A-8230598; and International Patent Publication WO-A-94/2563 the disclosures of each of which are hereby expressly incorporated herein by reference.

There has been a specific requirement to achieve reliable attachment of components in the pick-and-place processes. In this respect the correct application of flux is a critical consideration. If sufficient flux is not applied (for example insufficient amounts being used or insufficient coverage with flux) effective soldering may not be achieved at each solder point. This ultimately can lead to faulty interconnects/circuits being created which is undesirable.

It has been generally recognised in the art that providing a flux material which achieves a number of functions is desirable. In particular it is desirable that the flux material provides good surface activation. In this respect, it has been known to include an activator component within the flux material which will act to remove oxidised material from a metal surface, thereby allowing better solder to metal interconnection and ultimately metal (PCB) to metal (electronic component) interconnection.

Activators are added to decompose and remove any oxide film existing in the portion where soldering is going to be carried out, and are usually organic compounds containing halides, typically amine hydrohalides, such as diethylamine hydrochloride or weak halide-free organic acids.

In particular, it is desirable to use a carboxylic acid which melts at a temperature in the range of from 75 to 250 degrees Celsius as described in European Patent Publication No. 0 620 077 A.

It would be of particular importance to more reliably apply flux to components particularly those of the type having pre-applied solder carried thereon. This will in turn mean lower rejection rates of the assembled electronic device.

SUMMARY OF THE INVENTION

The present invention provides a soldering flux composition comprising:

(i) a carrier vehicle comprising a solvent;

(ii) an activator component for activating a metal surface for soldering;

(iii) a gelling component to control flux rheology; and (iv) a colour-imparting component with an appropriate colour to facilitate optical detection of flux on a component to which the flux is applied.

The colour-imparting component can be of any suitable type and includes dyes or colourants. The colour may be due to fluorescent properties of the material. One criterion is that the given colour-imparting agent exhibits an appropriate degree of solubility in said flux. Suitable colour-imparting components such as dyes can be chosen from the group of monoazo, diazo, triarylmethane, xanthene, sulphonephthalein, acrdine, quinoline, azine, oxazine, anthraquinone and indigold dyes as described for instance in U.S. Pat. No. 6,241, 385.

Desirably, in a detection process utilizing a red light source the colour-imparting agent will comprise a blue, green or purple dye, more desirably a blue dye. Such materials may be selected from the group of Orasol Navy Blue™, Janus Green™, Methyl violet, Patent Blue, Victoria blue R™, Crystal violet, Irgalith Blue TNC™, Irgalith Magenta TCB™, Erythrosin extra Bluish™, chlorophenol blue, bromophenol blue, Savinyl blue B™, Orasol blue BLN™, Rhoduline violet, pinacyanol chloride, pinacyanol bromide, pinacyanol iodide, Solophenyl Brilliant Blue BL™, Nile blue A™, Gallocyanin™, Gallamine Blue™, Celestine blue, Methylene blue, Thinonin Toluidine Blue O, Methylene Green and Azure A/B/C™, Savinyl Green B™, Savinyl Blue RS, D+C Green 6™, Blue VIF Organol™, Celliton Blue Extra™, Alizarin Blue S™, Nitro Fast Green GSB, Chinalizarin, Oil Blue N, Solvay Purple™ and combinations thereof as described in U.S. Pat. No. 6,241,385.

Desirably, in a detection process utilizing a red light source the colour-imparting agent will comprise a blue, green or purple dye which may be selected from one or more compounds based on anthraquinone for example those of the formula:

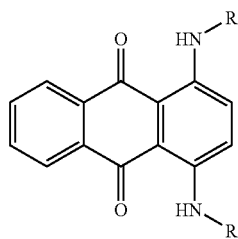

Desirably, in a detection process utilizing a red light source, R will be 3-N-cyclohexyl-2,4,6-trimethylbenzene-sulfonamide (CAS 23552-74-1). Alternatively, R additionally may be the same or different and may be selected from the group consisting of $C_1$-$C_{20}$ alkyl, $C_3$-$C_{20}$ cycloalkyl, $C_5$-$C_{20}$ aryl, $C_6$-$C_{20}$alkylaryl, $C_6$-$C_{20}$ arylakyl and combinations thereof.

Significantly, the appropriate selection of this component facilitates flux inspection by optical means. This is achieved through synergistic interaction with the illuminating light source in automated pick and place equipment such that the flux appears black. For example, if the illuminating light source is red, then a blue colour-imparting component is favoured. A component with inadequate flux for reliable soldering can be rejected.

Alternatively, if the illuminating light source is ultraviolet (UV) in nature, an appropriate fluorescing colour-imparting component which is a fluorescing component may be utilised in an analogous fashion.

Provided that the fluorescing colour-imparting agent exhibits an appropriate degree of solubility in said flux medium, suitable fluorescent dyes can be chosen, for example from the group of bisbenzoxazolyls, perylenes, anthracenes, indigoids and thioindigoids, imidazoles, naphtalimides, xanthenes, thioxanthenes, coumarins, and rhodamines.

Desirably, the fluorescence-imparting agent will be selected from one or more bisbenzoxazolyl-based compounds such as those of the bisbenzoxazolyl structure:

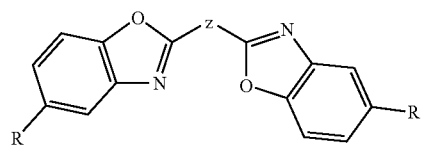

where, R is one of hydrogen, methyl, butyl or tert-butyl, and z is a thiophene ring. Further desirably, the bisbenzozazolyl compound is 2,5-bis(5'-Tert-butyl-2-benzoxazolyl) thiophene, where R is tert-butyl and z is a thiophene ring. Alternatively, R may additionally be the same or different and may be selected from the group consisting of hydrogen, $C_1$-$C_{20}$ alkyl, $C_3$-$C_{20}$ cycloalkyl and combinations thereof.

The inventive soldering flux also provides good green strength prior to soldering and, then, a robust soldered joint. In so doing it confers the various properties attributable to a good flux, for example removal of oxide layers from the metal surfaces on the PCB or other substrate, and protecting the clean joint surfaces from oxidation until soldering has taken place. This allows for an improved intermetallic contact.

The carrier vehicle of the flux composition may comprise at least one high boiling point solvent such as polyethylene glycol ether. This will not evaporate at ordinary room temperatures and will generally remain in place with the other components of the flux on the substrate to which it is applied.

When the flux is exposed to the higher temperatures typical of the heating station(s) of a reflow soldering machine the high boiling point solvent provides a medium that will carry the active material. For example in a typical machine a substrate such as a component and PCB treated with flux is heated stepwise to a temperature of approximately 230° C. Desirably the high boiling point solvent is a polyethylene glycol ether for example of the formula: $CH_3CH_2O(CH_2CH_2O)_2CH_2CH_3$.

The activator component of the solder flux composition is at least one of a carboxylic acid, rosin and optionally further includes a halogenated compound that liberates a hydrogen halide upon heating. Suitable halogenated compounds may be selected from the group consisting of trans-2,3-dibromo-2-butene-1,4-diol, meso-2,3-dibromosuccinic acid, tris-(2,3-dibromopropyl)-isocyanurate and combinations thereof. Activators are usually added to decompose and remove any oxide film existing in the portion of the substrate where soldering is going to be carried out. For copper substrates, such as those conventionally used in PCBs, removal of oxidised copper is desirable.

The rosin may be used for its properties as a weak acidic activator but it is also added to protect the metals from oxidation for example as a protective coating.

The overall effect of the inventive soldering is that of a more definite, improved and more robust interconnection between the electronic component and the metal on the substrate, for example copper on the board.

The rosin component is at least one material selected from diproportionated rosin; hydrogenated rosin, dehydrogenated rosin, or unmodified rosin. The high boiling point of rosin ensures that it will remain in place until soldering occurs.

Rosin is a natural material obtained from natural sources such as the sap of pine trees and contains isomers of abietic acid. Synthetic resins may also be used. These materials may be referred to generically as resins and as used herein the term "resin" includes natural resins such as rosin, chemically modified rosin, and synthetic resins. To form compositions of the invention resins may be dispersed in solvents, together with additional activators and gelling agents.

The flux composition will preferably comprise at least one colour-imparting component such as a compound based on the structural formulae above, present in the amount of 0.1% to 10% by weight of the total composition. More preferably at least one compound will be present in the amount 0.5% to 2% by weight of the total composition.

The flux composition will generally comprise activator component present in the amount 30% to 70% by weight of the total composition. More desirably the flux composition will comprise activator component present in the amount 40% to 60% by weight of the total composition.

The flux composition will generally comprise a gelling agent present in the amount 0.1% to 10% by weight of the total composition. More desirably the flux composition will comprise a gelling agent present in the amount 0.4% to 1% by weight of the total composition.

The rheology of the flux is dependent on the level of gelling agent present in said flux. Low quantities of gelling agent result in Newtonian rheology. Desirably, the flux composition will have Newtonian rheology. Flux compositions of Newtonian rheology are insensitive to dip speed, and are thus desirable for dipping applications of the composition.

For certain applications it may be desirable that the flux composition of the present invention does not comprise a gelling agent. Such compositions will have Newtonian rheology.

Solder can be used to attach an electronic component, for example a BGA, to a substrate after the component has been treated with the flux composition of the present invention.

The present invention also provides a method of soldering a component to a metallic substrate comprising the steps of:
(i) treating the component with a flux composition of the invention as described above; and
(ii) subsequently soldering the component to the metalised substrate.

The soldering step can be achieved by a re-flow process.

The present invention extends to the use of a compound with a structural formula that is based on anthraquinone for example those of the formula (wherein R is defined above):

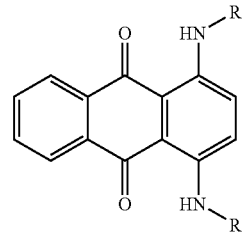

as a component in the manufacture of a liquid flux for use in a soldering process. In particular, use of the flux composition facilitates optical inspection of applied flux during an automated pick and place process.

The invention will now be described in more detail as set out below.

BRIEF DESCRIPTION OF THE DRAWINGS

FIG. 1 below shows a schematic of a typical method for application detection and assembly of a device on a PCB.

FIG. 2 shows two images illustrating the contrast under red light of a BGA without flux applied and with a flux composition of the invention applied.

DETAILED DESCRIPTION OF THE DRAWINGS

For ease of reference, as shown illustratively in FIG. 1, the dip flux process is broken down into three steps shown by individual images in the schematics. In the first step (Step 1) a component (in this case a BGA with reference numeral 1) is dipped in a reservoir or bath 2 of tacky flux 3 that includes a blue dye. The flux 3 has been levelled with a doctor blade 4. Having a uniform level of flux allows for uniform dipping of a component to be soldered. In this case the balls of solder 5 of the BGA are dipped in the bath. The tacky coating adheres to the solder.

The second step (Step 2) shows a pick up nozzle 6 (which may also be used for dipping). The fluxed BGA device 1, and in particular the solder balls with tacky flux, is exposed to light 7 from a light source 8 of appropriate wavelength with reflected light detected by a detector 9. The detector 9 is adapted to compare the reflected light pattern of the fluxed component against a standard to determine if the component is sufficiently fluxed.

In the third step (Step 3), the correctly fluxed component is placed on the PCB substrate 10 having been aligned with connective pads 12 on the PCB. Had the fluxing of the BGA being insufficient for reliable soldering the detector 9 would pick this up from the reflective light pattern and the BGA can be rejected as non-suitable for placing on the PCB. Such a rejected BGA can be taken out of the processing environment or possibly recycled for further fluxing.

The second step is exemplified by FIG. 2 in which the presence of flux on the dipped EGA is manifest as a darker image than that in which no flux has been applied. Detection of flux is possible in this way with identification of incorrectly fluxed components as a possibility. Rejection of incorrectly fluxed components can take place.

EXAMPLES

A BGA was dipped in flux according to the present invention. The flux comprised DCA flux (Product No. E/U/2290 available from Henkel Loctite Adhesives UK) with blue dye (Savinyl Blue RS available from Clariant) using a MY9E pick and place machine (manufactured by MyData). The images set out in FIG. 2 were taken using the integral inspection facility of the machine.

The first (top) image (photograph) of FIG. 2 shows the ball-grid solder array of the electronic component without flux; the second image shows the same component having had flux applied. The darkened image is caused by the blue colour of the flux. The colour contrast achieved as between the fluxed solder and the non-fluxed solder enables recognition (and rejection) of components (such as the BGA shown) with incomplete flux application.

The words "comprises/comprising" and the words "having/including" when used herein with reference to the present invention are used to specify the presence of stated features, integers, steps or components but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The invention claimed is:

1. A method of checking a component for the presence of adequate solder flux within an assembly operation the method comprising the steps of:
   (a) illuminating with a light source a component having a solder flux composition applied thereon, wherein the solder flux composition comprises:
      (i) a carrier vehicle comprising a polyethylene glycol ether solvent;
      (ii) an activator component present in an amount of 30% to 70% by weight of the total flux composition for activating a metal surface for soldering;
      (iii) a gelling component to control flux rheology; and
      (iv) a colour-imparting component with an appropriate colour to facilitate optical detection of flux on a component to which the flux is applied;
   (b) optically detecting the presence of flux; and
   (c) rejecting the component if sufficient flux is not present, wherein the colour-imparting component is soluble in the solder flux composition and wherein the light source emits a red light and the colour-imparting component is blue.

2. A method according to claim 1 additionally comprising the step of determining if sufficient solder is present.

3. A method according to claim 1 wherein the illuminating light is red light, with a wavelength between 613-653 nm.

4. A method according to claim 3 wherein the illuminating light is red light with a dominant wavelength of 633 nm.

5. A method according to claim 1 wherein the illuminating light is ultraviolet with a wavelength between 425-625 nm.

* * * * *